US011251012B2

(12) United States Patent
Yamada (10) Patent No.: US 11,251,012 B2
(45) Date of Patent: Feb. 15, 2022

(54) CHARGED PARTICLE BEAM WRITING APPARATUS AND CHARGED PARTICLE BEAM WRITING METHOD

(71) Applicant: NuFlare Technology, Inc., Yokohama (JP)

(72) Inventor: Taku Yamada, Yokohama (JP)

(73) Assignee: NuFlare Technology, Inc., Yokohama (JP)

(*) Notice: Subject to any disclaimer, the term of this patent is extended or adjusted under 35 U.S.C. 154(b) by 0 days.

(21) Appl. No.: 17/265,079

(22) PCT Filed: Jul. 4, 2019

(86) PCT No.: PCT/JP2019/026676
§ 371 (c)(1),
(2) Date: Feb. 1, 2021

(87) PCT Pub. No.: WO2020/026696
PCT Pub. Date: Feb. 6, 2020

(65) Prior Publication Data
US 2021/0305008 A1 Sep. 30, 2021

(30) Foreign Application Priority Data
Aug. 2, 2018 (JP) .............................. JP2018-146121

(51) Int. Cl.
*H01J 37/147* (2006.01)
*H01J 37/317* (2006.01)
(Continued)

(52) U.S. Cl.
CPC ........ *H01J 37/147* (2013.01); *H01J 37/3045* (2013.01); *H01J 37/3174* (2013.01);
(Continued)

(58) Field of Classification Search
CPC .. H01J 37/147; H01J 37/3045; H01J 37/3174; H01J 2237/151; H01J 37/20; H01J 2237/20228
(Continued)

(56) References Cited

U.S. PATENT DOCUMENTS 5,892,237 A * 4/1999 Kawakami ............. B82Y 10/00
250/492.22
2012/0007002 A1* 1/2012 Nakayamada ......... B82Y 10/00
250/492.22

FOREIGN PATENT DOCUMENTS

JP 9-45602 A 2/1997
JP 9-293671 A 11/1997
(Continued)

OTHER PUBLICATIONS

International Search Report dated Aug. 27, 2019 in PCT/JP2019/026676 filed on Jul. 4, 2019, 2 pages.

*Primary Examiner* — Michael Maskell
(74) *Attorney, Agent, or Firm* — Oblon, McClelland, Maier & Neustadt, L.L.P.

(57) ABSTRACT

Drift correction is performed with high accuracy while reducing the calculation amount. According to one aspect of the present invention, a charged particle beam writing apparatus includes an emitter emitting a charged particle beam, a deflector adjusting an irradiation position of the charged particle beam with respect to a substrate placed on a stage, a shot data generator generating shot data from writing data, the shot data including a shot size, a shot position, and a beam ON•OFF time per shot, a drift corrector referring to a plurality of pieces of the shot data for every predetermined area irradiated with the charged particle beam, or for every predetermined number of shots of the charged particle beam irradiated, calculating a drift amount of the irradiation position of the charged particle beam with which the sub-
(Continued)

strate is irradiated, based on the shot size, the shot position and the beam ON•OFF time, and generating correction information for correcting an irradiation position displacement based on the drift amount, and a deflection controller controlling a deflection amount achieved by the deflector based on the shot data and the correction information.

8 Claims, 5 Drawing Sheets (51) Int. Cl.
     *H01J 37/304*      (2006.01)
     *H01J 37/20*      (2006.01)

(52) U.S. Cl.
     CPC ......... *H01J 37/20* (2013.01); *H01J 2237/151* (2013.01); *H01J 2237/20228* (2013.01)

(58) Field of Classification Search
     USPC .......................................... 250/492.1–492.3
     See application file for complete search history.

(56) References Cited

FOREIGN PATENT DOCUMENTS

| | | |
|---|---|---|
| JP | 10-22195 A | 1/1998 |
| JP | 2781941 B2 | 7/1998 |
| JP | 10-256110 A | 9/1998 |
| JP | 10-256112 A | 9/1998 |
| JP | 2001-6992 A | 1/2001 |
| JP | 2010-73909 A | 4/2010 |
| JP | 2012-15246 A | 1/2012 |

\* cited by examiner

CHARGED PARTICLE BEAM WRITING APPARATUS AND CHARGED PARTICLE BEAM WRITING METHOD

TECHNICAL FIELD

The present invention relates to a charged particle beam writing apparatus and a charged particle beam writing method.

BACKGROUND

As LSI circuits are increasing in density, the line width of circuits of semiconductor devices is becoming finer. To form a desired circuit pattern onto a semiconductor device, a method of reducing and transferring, by using a reduction-projection exposure apparatus, onto a wafer a highly precise original image pattern (mask, or reticle, in particular, when used in a stepper or a scanner) formed on a quartz is employed. The highly precise original image pattern is written by using an electron beam writing apparatus, in which a technology commonly known as electron beam lithography is used.

In a charged particle beam writing apparatus, due to various factors, a phenomenon called beam drift may occur, in which an irradiation position of an electron beam is shifted as time elapses during writing. For instance, contamination adheres to an irradiation system of a deflection electrode or the like of the writing apparatus, the contamination is charged by scattered electrons from a target writing substrate, and beam drift occurs. Drift correction is performed to cancel the beam drift.

For instance, PTL 1 discloses a technique that calculates a drift amount from a correction calculation expression using parameters, and corrects a deflection amount achieved by a deflector, the parameters being a beam current amount per shot, a beam irradiation position, and a beam ON•OFF time. However, because the accumulated charge amount on the deflector surface is calculated for each shot, the amount of calculation increases as the number of shots increases. For instance, when the calculation time for the accumulated charge amount per shot is 1 µs, it takes approximately 28 hours to calculate for 100 giga ($1\times10^{11}$) shot, which is not practical, thus it is difficult to perform calculation in real time during writing.

PTL 2 discloses a technique that cumulatively adds a beam irradiation amount (=irradiation time×irradiation area) every certain time, and corrects a deflection amount achieved by a deflector, according to the accumulated adding amount. With this method, when the interval of calculation of the accumulated adding amount of the beam irradiation amount is decreased, the correction accuracy is increased, however, the calculation amount increases. When the interval of calculation of the accumulated adding amount is increased, the calculation amount is decreased, however, the correction accuracy is reduced. In this manner, a tradeoff relationship exists between the interval of calculation of the accumulated adding amount and the correction accuracy. Also, when the interval of calculation is made constant, there is a problem in that for a writing layout having a large variation in the number of shots, change in the number of shots cannot be coped with.

CITATION LIST

Patent Literature

PTL 1: Japanese Patent No. 4439038
PTL 2: Japanese Unexamined Patent Application Publication No. H9-45602
PTL 3: Japanese Unexamined Patent Application Publication No. H10-256110
PTL 4: Japanese Patent No. 2781941
PTL 5: Japanese Unexamined Patent Application Publication No. H10-22195
PTL 6: Japanese Unexamined Patent Application Publication No. 2010-73909
PTL 7: Japanese Unexamined Patent Application Publication No. H9-293671

SUMMARY OF INVENTION

It is an object of the present invention to provide a charged particle beam writing apparatus and a charged particle beam writing method that are capable of performing drift correction with high accuracy while reducing the calculation amount.

According to one aspect of the present invention, a charged particle beam writing apparatus includes an emitter emitting a charged particle beam, a deflector adjusting an irradiation position of the charged particle beam with respect to a substrate placed on a stage, a shot data generator generating shot data from writing data, the shot data including a shot size, a shot position, and a beam ON•OFF time per shot, a drift corrector referring to a plurality of pieces of the shot data for every predetermined area irradiated with the charged particle beam, or for every predetermined number of shots of the charged particle beam irradiated, calculating a drift amount of the irradiation position of the charged particle beam with which the substrate is irradiated, based on the shot size, the shot position and the beam ON•OFF time, and generating correction information for correcting an irradiation position displacement based on the drift amount, and a deflection controller controlling a deflection amount achieved by the deflector based on the shot data and the correction information.

According to one aspect of the present invention, a charged particle beam writing method includes emitting a charged particle beam, adjusting an irradiation position of the charged particle beam with respect to a substrate placed on a stage using a deflector, generating shot data from writing data, the shot data including a shot size, a shot position, and a beam ON•OFF time per shot, referring to a plurality of pieces of the shot data for every predetermined area irradiated with the charged particle beam, or for every predetermined number of shots of the charged particle beam irradiated, and calculating a drift amount of the irradiation position of the charged particle beam with which the substrate is irradiated, based on the shot size, the shot position and the beam ON•OFF time, generating correction information for correcting an irradiation position displacement based on the drift amount, and controlling a deflection amount achieved by the deflector based on the shot data and the correction information.

Advantageous Effects of Invention

According to the present invention, it is possible to perform drift correction with high accuracy while reducing the calculation amount.

DESCRIPTION OF EMBODIMENTS

Hereinafter, an embodiment of the present invention will be described based on the drawings. In the present embodiment, a configuration using an electron beam will be described as an example of a charged particle beam. However, the charged particle beam is not limited to an electron beam, and may be an ion beam or the like.

Figure 1:
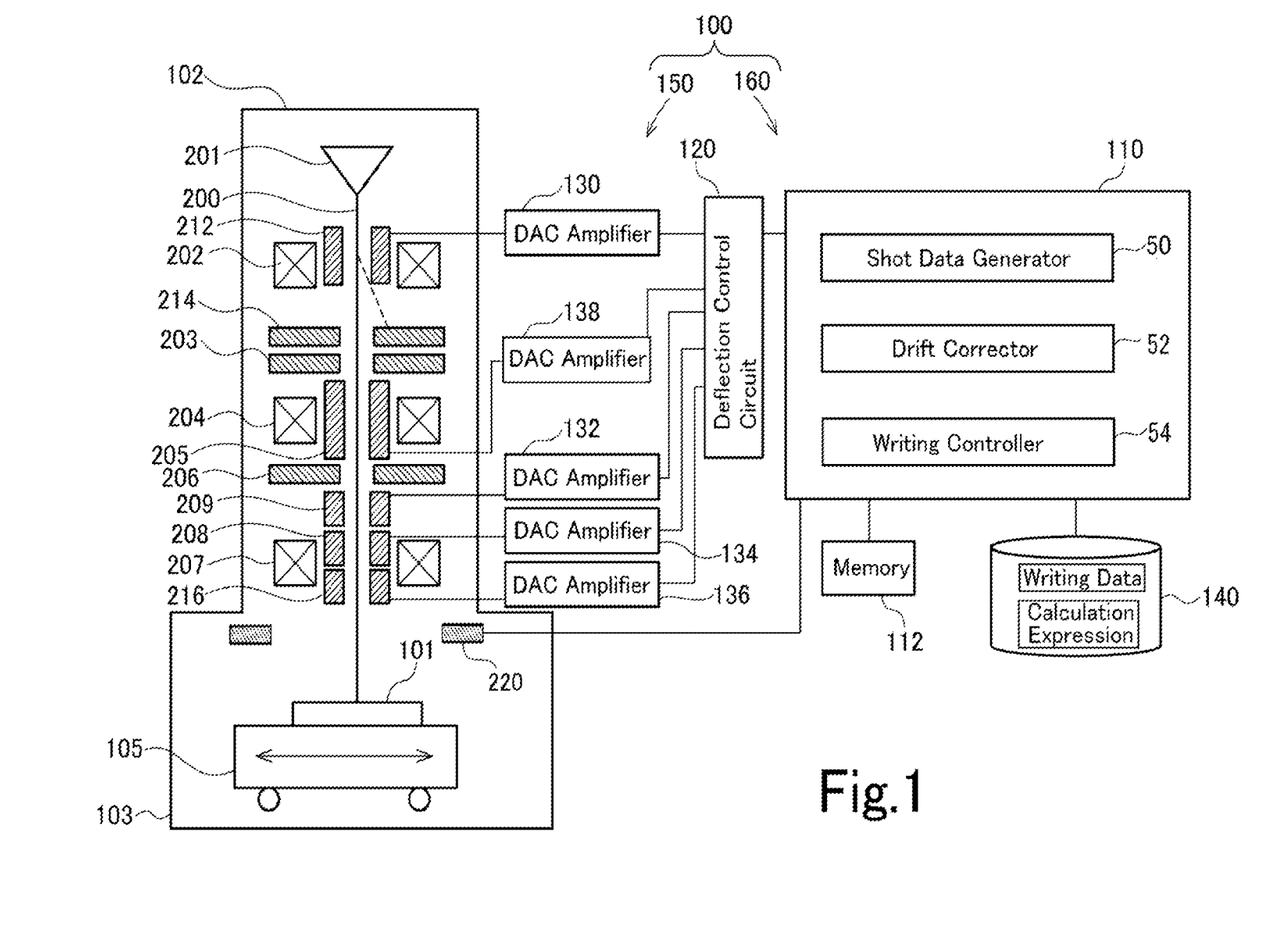
FIG. 1 is a schematic diagram of a charged particle beam writing apparatus according to an embodiment of the present invention.

FIG. 1 is a conceptual diagram illustrating the configuration of a writing apparatus in the embodiment. In FIG. 1, a writing apparatus 100 includes a writer 150 and a controller 160. The writer 150 includes an electron column 102 and a writing chamber 103. In the electron column 102, an electron gun 201, an illuminating lens 202, a blanking deflector 212, a blanking aperture 214, a first shaping aperture 203, a projection lens 204, a shaping deflector 205, a second shaping aperture 206, an objective lens 207, a main deflector 208, a sub-deflector 209, and a sub-sub-deflector 216 are disposed.

In the writing chamber 103, an XY stage 105 movable in the XY directions is placed. On the XY stage 105, a substrate 101 is placed, which is a writing target coated with a resist. The substrate 101 includes a mask for exposure, a silicon wafer, and mask blanks for manufacturing a semiconductor device.

On the XY stage 105, a mark (illustration is omitted) for measuring a drift amount of an electron beam is provided. The mark has, for instance, a cross shape or a dot shape, and is composed of heavy metal such as tantalum or tungsten on a silicon substrate.

At a position above the XY stage 105, an irradiation position detector 220 is provided, that detects an irradiation position (beam position) of an electron beam by irradiating the mark with the electron beam. As the irradiation position detector 220, for instance, an electron detector can be used, that scans the mark with an electron beam and detects a reflection electron reflected by the mark as a current value. The later-described control computer 110 is notified of a detected beam position.

When an electron beam 200 emitted from the electron gun 201 (emitter) provided in the electron column 102 passes through the blanking deflector 212, whether or not the substrate is irradiated with the electron beam is switched by the blanking deflector 212.

The first shaping aperture 203 having a rectangular opening A1 (see FIG. 2) is irradiated with the electron beam 200 by the illuminating lens 202. An electron beam B passes through the opening A1 of the first shaping aperture 203, and thus is shaped in a rectangle.

Figure 2:
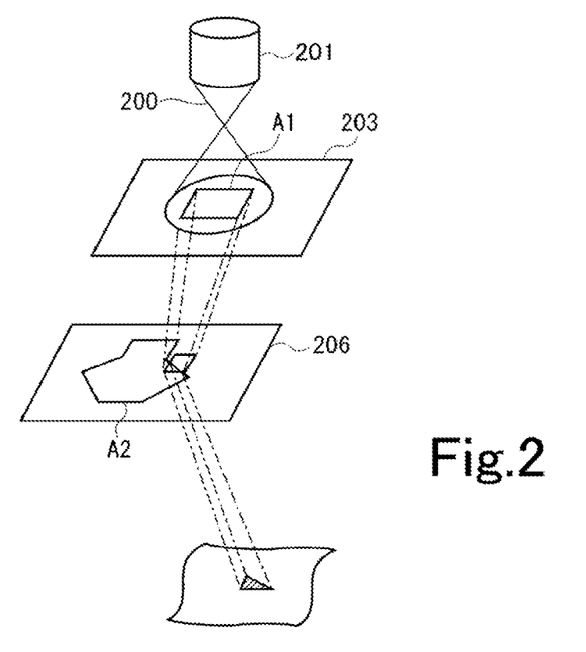
FIG. 2 is a perspective view of a first shaping aperture and a second shaping aperture.

The electron beam 200 having a first aperture image passing through the first shaping aperture 203 is projected by the projection lens 204 on the second shaping aperture 206 having a variable shaped opening A2 (see FIG. 2). At this point, the first aperture image projected on the second shaping aperture 206 is deflection-controlled by the shaping deflector 205, thus it is possible to change (perform variable shaping) the shape and size of the electron beam passing through the variable shaped opening A2.

The electron beam 200 having a second aperture image passing through the variable shaped opening A2 of the second shaping aperture 206 is focused by the objective lens 207, deflected by the main deflector 208, the sub-deflector 209, and the sub-sub-deflector 216, and is emitted to the substrate 101 placed on the XY stage 105 which continuously moves.

The controller 160 has a control computer 110, a memory 112, a deflection control circuit 120, DAC (digital·analog converters) amplifiers 130, 132, 134, 136, 138 (deflection amplifiers), and a storage device 140.

The DAC amplifiers 130, 132, 134, 136, 138 are connected to the deflection control circuit 120. The DAC amplifier 130 is connected to the blanking deflector 212. The DAC amplifier 132 is connected to the sub-deflector 209. The DAC amplifier 134 is connected to the main deflector 208. The DAC amplifier 136 is connected to the sub-sub-deflector 216. The DAC amplifier 138 is connected to the shaping deflector 205.

The control computer 110 includes a shot data generator 50, a drift corrector 52, and a writing controller 54. The functions of the shot data generator 50, the drift corrector 52, and the writing controller 54 may be implemented by software or implemented by hardware.

Figure 3:
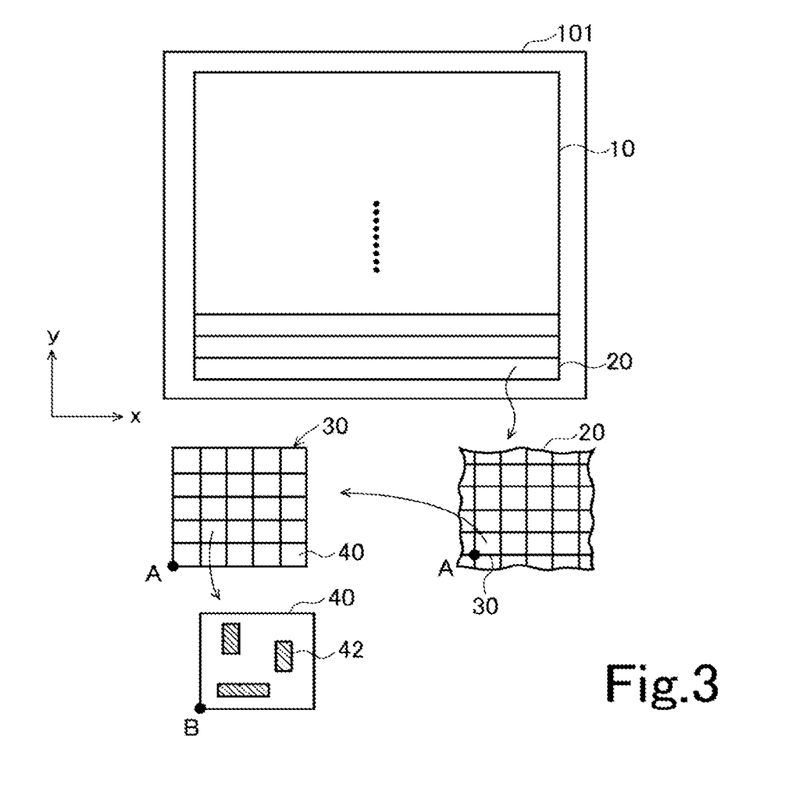
FIG. 3 is a conceptual chart for explaining a deflection area.

FIG. 3 is a conceptual chart for explaining a deflection area. As illustrated in FIG. 3, a writing area 10 of the substrate 101 is virtually divided with a deflectable width of the main deflector 208 into multiple rectangular stripe areas 20 in the y direction, for instance. Then, the areas obtained by dividing each stripe area 20 in the x direction with the deflectable width of the main deflector 208 provide deflection areas (main deflection areas) of the main deflector 208.

The main deflection areas are each virtually divided into multiple mesh-shaped sub-fields (SF) 30 with a deflectable size of the sub-deflector 209. Each SF 30 is then virtually divided into multiple mesh-shaped under sub-fields (here referred to as "TF" using an abbreviation for Tertiary Deflection Field which means the third deflection) 40 with a deflectable size of the sub-sub-deflector 216. A shot figure is written at shot positions 42 of each TF 40.

A digital signal for blanking control is outputted from the deflection control circuit 120 to the DAC amplifier 130. The DAC amplifier 130 converts the digital signal to an analog signal, and applies an amplified analog signal to the blanking deflector 212 as a deflection voltage. The deflection voltage causes the electron beam 200 to be deflected, and blanking control is performed on each shot.

A digital signal for shaping deflection is outputted from deflection control circuit 120 to the DAC amplifier 138. The DAC amplifier 138 converts the digital signal to an analog signal, and applies an amplified analog signal to the deflector 205 as a deflection voltage. The deflection voltage causes the electron beam 200 to be deflected to a specific position of the second shaping aperture 206, and an electron beam having desired size and shape is formed.

A digital signal for main deflection control is outputted from deflection control circuit 120 to the DAC amplifier 134. The DAC amplifier 134 converts the digital signal to an analog signal, and applies an amplified analog signal to the main deflector 208 as a deflection voltage. The deflection voltage causes the electron beam 200 to be deflected, and the beam of each shot is deflected to a reference position A (for instance, the center position or the lower left corner position of a corresponding SF) of a predetermined sub-field (SF) which is virtually divided in a mesh shape. When writing is performed while the XY stage 105 is continuously moved, the deflection voltage also includes a deflection voltage for tracking to follow the movement of the stage.

A digital signal for sub-deflection control is outputted from deflection control circuit 120 to the DAC amplifier 132. The DAC amplifier 132 converts the digital signal to an analog signal, and applies an amplified analog signal to the sub-deflector 209 as a deflection voltage. The deflection voltage causes the electron beam 200 to be deflected, and the beam of each shot is deflected to a reference position B (for instance, the center position or the lower left corner position of a corresponding TF) of a TF 40 which is the smallest deflection area.

A digital signal for sub-sub-deflection control is outputted from deflection control circuit 120 to the DAC amplifier 136. The DAC amplifier 136 converts the digital signal to an analog signal, and applies an amplified analog signal to the sub-sub-deflector 216 as a deflection voltage. The deflection voltage causes the electron beam 200 to be deflected, and the beam of each shot is deflected to each shot position 42 in the TF 40.

In the writing apparatus 100, writing processing is performed on each stripe area 20 using deflectors in multiple stages. Here, as an example, 3-stage deflectors are used, which has the main deflector 208, the sub-deflector 209, and the sub-sub-deflector 216. While the XY stage 105 is continuously moved, for instance, in the -x direction, writing is performed on the first stripe area 20 in the x direction. After the writing on the first stripe area 20 is completed, writing is performed on the second stripe area 20 similarly, or in the opposite direction. Subsequently, similarly, writing is performed on the third or later stripe area 20.

The main deflector 208 sequentially deflects the electron beam 200 to the reference position A of the SF 30 so as to follow the movement of the XY stage 105. In addition, the sub-deflector 209 sequentially deflects the electron beam 200 from the reference position A of each SF 30 to the reference position B of a TF 40. The sub-sub-deflector 216 then deflects the electron beam 200 from the reference position B of each TF 40 to the shot position 42 irradiated with a beam in the TF 40.

In this manner, the deflector 208, the sub-deflector 209, and the sub-sub-deflector 216 have deflection areas in different sizes. The TF 40 is the smallest deflection area out of the deflection areas of the deflectors in multiple stages.

The storage device 140 is, for instance, a magnetic disk device, and stores writing data for writing a pattern on the substrate 101. The writing data is such data that is converted from design data (layout data) to a format for the writing apparatus 100, and is inputted from an external device to the storage device 140, and stored therein.

The shot data generator 50 performs data conversion processing in multiple stages on the writing data stored in the storage device 140, divides each figure pattern as a writing target into shot figures in a size, each of which can be irradiated by a single shot, and generates shot data in a format specific to the writing apparatus. In the shot data, for each shot, for instance, a figure code indicating a figure type of each shot figure, a figure size (shot size), a shot position, a beam ON•OFF time are defined. The generated shot data is temporarily stored in the memory 112.

The beam ON time included in the shot data is obtained by calculating an irradiation amount (dose amount) Q of the electron beam at each position of the writing area 10 in consideration of factors which cause a dimensional variation of a patter, such as a proximity effect, a fogging effect, and a loading effect, and dividing the calculated irradiation amount Q by a current density J. The beam OFF time is calculated from the stage movement speed, the beam movement amount during writing, and the settling time of the DAC amplifiers.

The generation of the shot data is performed concurrently with the writing processing, and shot data for multiple shots is generated in advance, and stored in the memory 112. For instance, the shot data for one stripe area 20 is generated in advance, and stored in the memory 112.

In the present embodiment, the shot data for multiple shots generated in advance is referred to, and an accumulated charge amount on each surface of the deflectors (the main deflector 208, the sub-deflector 209 or the sub-sub-deflector 216) is calculated, and charge drift due to charge up phenomenon is corrected using accumulated number of shots of the multiple shots, an averaged shot size (beam size) and shot positions (beam deflection positions).

Figure 4:
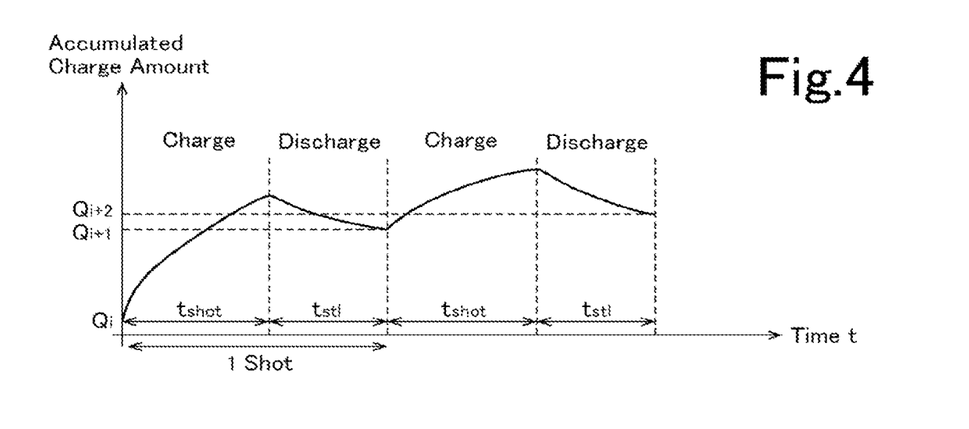
FIG. 4 is a graph illustrating a change in the accumulated charge amount.

As illustrated in FIG. 4, one shot has a beam ON period $t_{shot}$ and a beam OFF period $t_{stl}$, and a charge phase due to scattered electrons at the time of beam irradiation (beam ON) and a discharge phase at the time of beam OFF are repeated.

Figure 5:
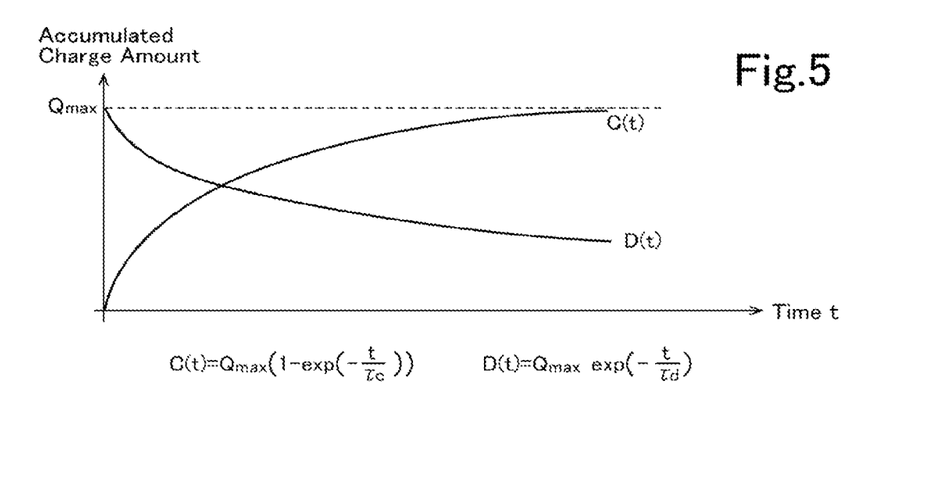
FIG. 5 is a graph illustrating functions of charge and discharge.

In each of multiple electrodes included in the deflectors, the change in the accumulated charge amount on the electrode surface can be expressed by functions $C(t)$, $D(t)$ illustrated in FIG. 5. The function $C(t)$ shows charge at the time of beam ON, and the function $D(t)$ shows discharge at the time of beam OFF. In the mathematical expressions in FIG. 5, $\tau_c$ is a time constant indicating likelihood of being charged, and $\tau_d$ is a time constant indicating likelihood of being discharged.

Let $Q_i$ be the accumulated charge amount at the start of the ith shot illustrated in FIG. 4, then the accumulated charge amount $Q_i+1$ at the end time of the ith shot (at the start time of the (i+1)th shot), the accumulated charge amount $Q_{i+2}$ at the end time of (i+1)th shot (at the start time of the (i+2)th shot) can be respectively expressed by Expression 1 below. In Expression 1, $Q_{max}$ is a saturated electron amount, $t_{shot}$ is a beam ON time (shot time), $t_{stl}$ is a beam OFF time (settling time), $\tau_c$ is a time constant for charge, and $\tau_d$ is a time constant for discharge.

$$Q_{i+1} = \exp\left(-\frac{t_{shot}}{\tau_c} - \frac{t_{stl}}{\tau_d}\right)\left[Q_{max}\left\{\exp\left(\frac{t_{shot}}{\tau_c}\right) - 1\right\} + Q_i\right] \quad \text{[Expression 1]}$$

$$Q_{i+2} = \exp\left(-\frac{t_{shot}}{\tau_c} - \frac{t_{stl}}{\tau_d}\right)\left[Q_{max}\left\{\exp\left(\frac{t_{shot}}{\tau_c}\right) - 1\right\} + Q_{i+1}\right]$$

The graph illustrated in FIG. 4 corresponds to a calculation expression when the accumulated charge amount is calculated shot by shot. When the accumulated charge amount is calculated shot by shot, the amount of calculation increases as the number of shots increases, thus it is difficult to perform drift correction in real time concurrently with the writing processing. For this reason, in the present embodiment, the calculation speed is increased by calculating accumulated charge amount for multiple shots collectively, thereby making it possible to perform drift correction in real time.

Figure 6:
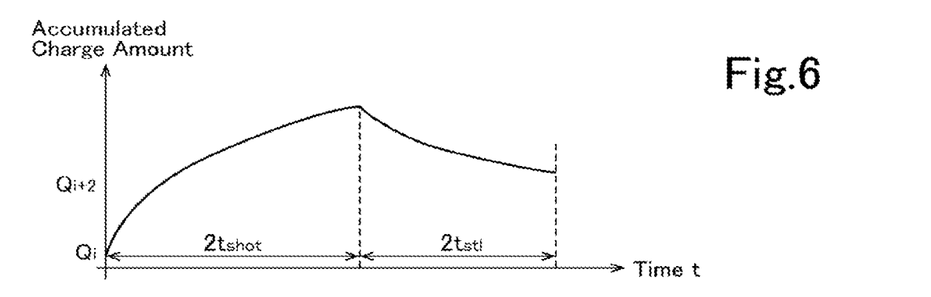
FIG. 6 is a graph illustrating a change in the accumulated charge amount.

For instance, when the accumulated charge amount is calculated for every two shots, it is possible to simplify the calculation by estimating that the accumulated charge amount varies as in FIG. 6. In this case, the accumulated charge amount $Q_{i+2}$ at the end time of the (i+1)th shot (at the start time of the (i+2)th shot) can be expressed by the following Expression 2 from the accumulated charge amount $Q_i$ at the start time of the ith shot.

$$Q_{i+2} = \exp\left(-\frac{2t_{shot}}{\tau_c} - \frac{2t_{stl}}{\tau_d}\right)\left[Q_{max}\left\{\exp\left(\frac{2t_{shot}}{\tau_c}\right) - 1\right\} + Q_i\right] \quad \text{[Expression 2]}$$

Figure 7:
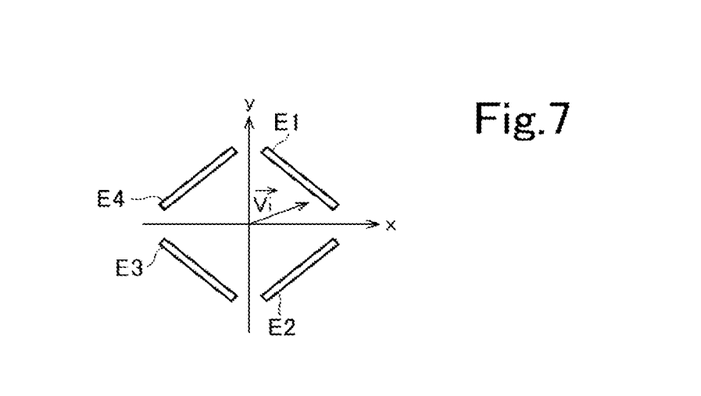
FIG. 7 is a view illustrating an example of a deflection electrode.

Also, since multiple electrodes are used in each deflector, charged sources are probably present at multiple positions. Thus, as illustrated in FIG. 7, a case will be discussed where a deflector consists of four electrodes E1 to E4, and the accumulated charge amount (charge amount) of each electrode is calculated for every N-shots (for N shots collectively). The accumulated charge amount $Q_{i+N,j}$ after N shots can be determined by the following Expression 3 from the accumulated charge amount $Q_{i,j}$ at the start of the ith shot of the electrode Ej (j=1 to 4).

$$Q_{i+N,j} = \exp\left(-S \cdot A \frac{t_{shot(total)}}{\tau_{cj}} - \frac{t_{stl(total)}}{\tau_{dj}}\right) \quad \text{[Expression 3]}$$
$$\left[Q_{max}\left\{\exp\left(S \cdot A \frac{t_{shot(total)}}{\tau_{cj}}\right) - 1\right\} + Q_{i,j}\right]$$
$$S = \overline{shotsize}/maxshotsize$$
$$A = \left[1 + \tanh\left(a \times \vec{n_j} \cdot \vec{V}\right)\right]/2$$

accumulated number of shots: N
accumulated shot time: $t_{shot(total)}$
accumulated settling time
(=accumulated writing time−accumulated shot time): $t_{stl(total)}$
average deflection direction: $\vec{V}$
average shot size: $\overline{shotsize}$ In Expression 3, time constants $\tau_{cj}$, $\tau_{dj}$, coefficients $\alpha$, $Q_{max,j}$ are state parameters specific to the apparatus regardless of the writing layout, thus can be determined in advance from a result of measurement of a change in the drift under a condition that there are two or more beam irradiation amounts or shot intervals, and deflection positions.

The drift amount can be calculated by the following Expression 4 using the accumulated charge amount of each electrode.

$$\text{Drift amount } \vec{D_i} = \quad \text{[Expression 4]}$$
$$\sum_j (-Q_{ij})\vec{n_j} = \begin{pmatrix} -Q_{i1} - Q_{i2} + Q_{i3} + Q_{i4} \\ -Q_{i1} + Q_{i2} + Q_{i3} - Q_{i4} \end{pmatrix}$$

Figure 8:
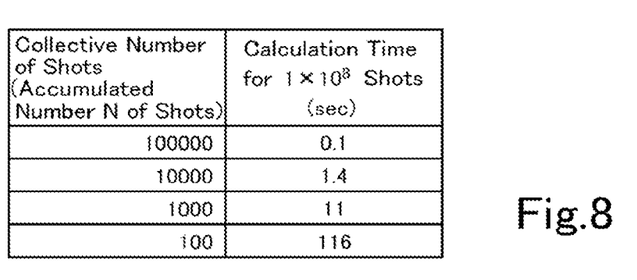
FIG. 8 is a table illustrating an example of a relationship between accumulated number of shots and drift calculation time.

FIG. 8 illustrates an example of a relationship between the collective number of shots (the accumulated number N of shots in Expression 3) and the time it takes to calculate the drift amount for $1 \times 10^8$ shots. The greater the accumulated number N of shots is, the shorter time it takes to calculate the drift amount for $1 \times 10^8$ shots. Even when the accumulated number N of shots was changed to 100, 1000, 10000, 100000, 1000000, the calculated drift amount hardly changed.

The Expressions 3, 4 stated above and the calculation expression data including the time constants $\tau_{cj}$, $\tau_{dj}$, the coefficients $\alpha$, $Q_{max,j}$ are stored in the storage device 140. The drift corrector 52 retrieves calculation expression data from the storage device 140. The drift corrector 52 refers to multiple pieces of shot data stored in the memory 112, calculates accumulated shot times (the total of beam ON times) of multiple shots, accumulated settling times (the total of beam OFF times), an average deflection direction, and an average shot size, and calculates the accumulated charge amount of each electrode by substituting the calculated values into the calculation expression.

The drift corrector 52 calculates a drift amount from the accumulated charge amount of each electrode, and determines a drift correction amount which cancels the drift amount. The drift corrector 52 generates correction information for the deflection amount (beam irradiation position) of the electron beam based on the drift correction amount, and provides the correction information to the writing controller 54. The writing controller 54 provides a correction amount for the beam irradiation position to the deflection control circuit 120 using the correction information.

The writing controller 54 transfers the shot data to the deflection control circuit 120. The deflection control circuit 120 outputs a signal for blanking control to the DAC amplifier 130 and outputs a signal for shaping deflection to the DAC amplifier 138 based on the shot data.

The deflection control circuit 120 outputs a signal for deflection control to the DAC amplifiers 132, 134, 136 based on the shot data and the correction amount for the beam irradiation position. Consequently, the beam irradiation position in the writer 150 is corrected.

In this manner, according to the present embodiment, multiple pieces of shot data in a specific interval are referred to, and a drift amount is calculated using an accumulated number of shots, a beam size averaged in the interval, a beam deflection position (deflection direction), accumulated times of beam ON•OFF in the interval, thus it is possible to perform drift correction with high accuracy while reducing the amount of calculation.

The specific interval (the accumulated number N of shots in Expression 3) is not particularly limited, and may be, for instance, every sub-field (SF 30), every under sub-field (TF 40), or every predetermined number of shots.

In the embodiment described above, charge drift due to charge up phenomenon can be corrected, however, drift (disturbance drift) due to factors such as heat or an atmospheric pressure also occurs in the writing apparatus. Thus, the writing accuracy can be further improved by correcting the disturbance drift. The disturbance drift can be calculated by the following method.

During writing processing, a writing operation is temporarily stopped in any interval, and a beam drift amount is measured. For instance, a mark on the XY stage 105 is scanned by an electron beam, and a beam drift amount is measured based on the beam position detected by the irradiation position detector 220 from the current amount of reflected electrons.

Figure 9:
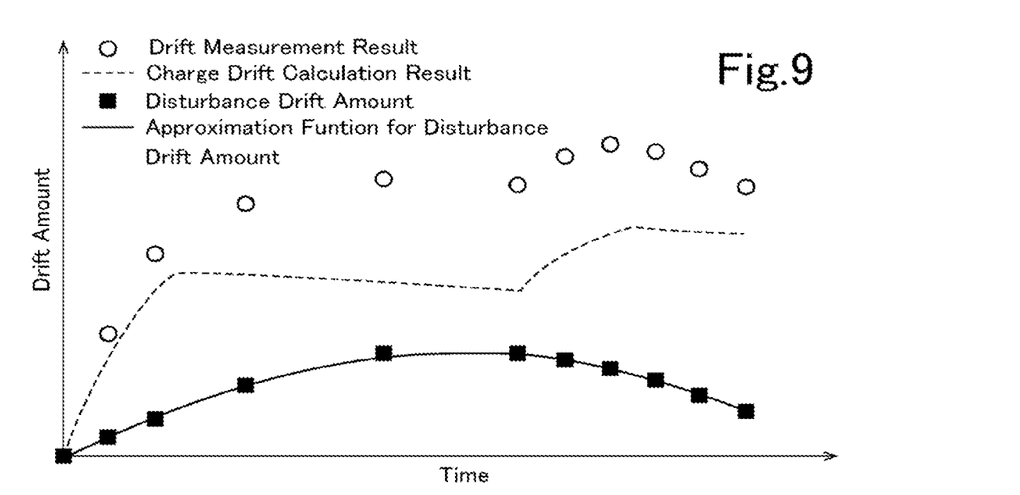
FIG. 9 is a graph illustrating examples of a drift measurement result, a charge drift calculation result, and a change in disturbance drift amount.

The measurement value includes the effect from both charge drift and disturbance drift, thus the disturbance drift amount is determined by subtracting the calculation result of charge drift immediately before temporary stop of the writing operation from the measurement value. The disturbance drift amount is determined multiple times for predetermined time intervals, and its trend is approximated by a function. The approximation function for the disturbance drift amount is registered in a memory. FIG. 9 illustrates examples of a drift measurement result, a charge drift calculation result, a disturbance drift amount, and an approximation function for the disturbance drift amount.

After the approximation function is calculated, the drift corrector 52 predicts the change in the disturbance drift amount using the function. The predicted disturbance drift amount, and the calculation result of the charge drift are combined to be an overall beam drift amount, and the deflection amount is corrected.

Although a writing apparatus using a single beam has been described in the embodiment described above, a multi-beam writing apparatus may be applicable.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The present invention is described above in detail with reference to particular aspects, but it should be clear to the skilled person in the art that various modifications are possible without departing from the intention and scope of the present invention.

The present application is based upon Japanese Patent Application No. 2018-146121, filed on Aug. 2, 2018, the entire contents of which are incorporated herein by reference.

REFERENCE SIGNS LIST

50 SHOT DATA GENERATOR
52 DRIFT CORRECTOR
54 WRITING CONTROLLER
100 WRITING APPARATUS
110 CONTROL COMPUTER
150 WRITER
160 CONTROLLER

The invention claimed is:

1. A charged particle beam writing apparatus comprising:
an emitter emitting a charged particle beam;
a deflector adjusting an irradiation position of the charged particle beam with respect to a substrate placed on a stage;
a shot data generator generating shot data from writing data, the shot data including a shot size, a shot position, and a beam ON•OFF time per shot;
a drift corrector referring to a plurality of pieces of the shot data for every predetermined area irradiated with the charged particle beam, or for every predetermined number of shots of the charged particle beam irradiated, calculating a drift amount of the irradiation position of the charged particle beam with which the substrate is irradiated, based on the shot size, the shot position and the beam ON•OFF time, and generating correction information for correcting an irradiation position displacement based on the drift amount; and
a deflection controller controlling a deflection amount achieved by the deflector based on the shot data and the correction information.

2. The charged particle beam writing apparatus according to claim 1,
wherein the deflector includes a plurality of electrodes, and
the drift corrector calculates a charge amount of each of the plurality of electrodes of the deflector using an average value of shot sizes of a plurality of shots, an average value of shot positions of the plurality of shots, and an accumulated beam ON•OFF time of the plurality of shots, and calculates the drift amount from the charge amount of each electrode.

3. The charged particle beam writing apparatus according to claim 1,
wherein the deflector includes:
a first deflector deflecting the charged particle beam to reference positions of a plurality of first minor areas in which a writing area of the substrate is virtually divided into mesh shapes;
a second deflector deflecting the charged particle beam from the reference position of each of the first minor areas to reference positions of a plurality of second minor areas in which the first minor area is virtually divided into mesh shapes; and
a third deflector deflecting the charged particle beam from the reference position of each of the second minor areas to a shot position irradiated with a beam in the second minor area, and
the drift corrector calculates the drift amount by referring to the shot data of the plurality of shots included in the first minor area or the shot data of the plurality of shots included in the second minor area.

4. The charged particle beam writing apparatus according to claim 1, further comprising:
a mark provided on the stage; and
an irradiation position detector detecting a beam irradiation position from a reflected charged particle when the mark is scanned by the charged particle beam,
wherein a disturbance drift amount is determined from a difference between the drift amount measured from the beam irradiation position detected by the irradiation position detector and the drift amount calculated by the drift corrector.

5. A charged particle beam writing method comprising:
emitting a charged particle beam;
adjusting an irradiation position of the charged particle beam with respect to a substrate placed on a stage using a deflector;
generating shot data from writing data, the shot data including a shot size, a shot position, and a beam ON•OFF time per shot;
referring to a plurality of pieces of the shot data for every predetermined area irradiated with the charged particle beam, or for every predetermined number of shots of the charged particle beam irradiated, and calculating a drift amount of the irradiation position of the charged particle beam with which the substrate is irradiated, based on the shot size, the shot position and the beam ON•OFF time;
generating correction information for correcting an irradiation position displacement based on the drift amount; and
controlling a deflection amount achieved by the deflector based on the shot data and the correction information.

6. The charged particle beam writing method according to claim 5,
wherein the deflector includes a plurality of electrodes, and
a charge amount of each of the plurality of electrodes of the deflector is calculated using an average value of shot sizes of a plurality of shots, an average value of shot positions of the plurality of shots, and an accumulated beam ON•OFF time of the plurality of shots, and the drift amount is calculated from the charge amount of each electrode.

7. The charged particle beam writing method according to claim 5,
wherein the deflector includes:
a first deflector deflecting the charged particle beam to reference positions of a plurality of first minor areas in which a writing area of the substrate is virtually divided into mesh shapes;
a second deflector deflecting the charged particle beam from the reference position of each of the first minor areas to reference positions of a plurality of second minor areas in which the first minor area is virtually divided into mesh shapes; and
a third deflector deflecting the charged particle beam from the reference position of each of the second minor areas to a shot position irradiated with a beam in the second minor area, and
the drift amount is calculated by referring to the shot data of the plurality of shots included in the first minor area or the shot data of the plurality of shots included in the second minor area.

8. The charged particle beam writing method according to claim 5,
wherein a beam irradiation position is detected from a reflected charged particle when a mark provided on the stage is scanned by the charged particle beam, and
a disturbance drift amount is determined from a difference between the drift amount measured from the detected beam irradiation position and the calculated drift amount.

* * * * *